United States Patent [19]

Biegesen et al.

[11] 4,330,363

[45] May 18, 1982

[54] THERMAL GRADIENT CONTROL FOR ENHANCED LASER INDUCED CRYSTALLIZATION OF PREDEFINED SEMICONDUCTOR AREAS

[75] Inventors: David K. Biegesen, Woodside; Noble M. Johnson, Menlo Park; Dirk J. Bartlelink, Los Altos; Marvin D. Moyer, Cupertino, all of Calif.

[73] Assignee: Xerox Corporation, Stamford, Conn.

[21] Appl. No.: 182,195

[22] Filed: Aug. 28, 1980

[51] Int. Cl.³ .............................................. C30B 13/06
[52] U.S. Cl. .................................. 156/620; 156/603; 156/DIG. 80; 156/DIG. 88; 156/DIG. 102
[58] Field of Search ....... 156/603, 620, 608, DIG. 64, 156/DIG. 80, DIG. 88, DIG. 99, DIG. 102, DIG. 103; 75/65 ZM; 148/1.5, 171, 174

[56] References Cited

U.S. PATENT DOCUMENTS

| | | | |
|---|---|---|---|
| 3,335,038 | 8/1967 | Doo | 156/620 |
| 3,348,962 | 10/1967 | Grossman et al. | 156/620 |
| 3,549,432 | 12/1970 | Silvertsen | 156/DIG. 80 |
| 3,585,088 | 6/1971 | Schwuttke et al. | 156/DIG. 80 |
| 3,600,237 | 8/1971 | Davis et al. | 156/DIG. 88 |
| 3,737,739 | 6/1973 | Blakeslee et al. | 148/174 |
| 3,764,776 | 10/1973 | Hierholzer et al. | 156/DIG. 80 |
| 4,199,397 | 4/1980 | Gurtler | 156/620 |

OTHER PUBLICATIONS

Gibbons et al., "Laser Recrystallization", published in Appl. Phys. Lett., 34(12), 15 Jun. 1979, pp. 831–833.
Geis et al., "Crystallographic Orientation", published in Appl. Phys. Lett., 35(1), 1 Jul. 1979, pp. 71–74.
Fan et al., "Crystallization of Amorphous Silicon", published in Appl. Phys. Lett., 27(4), 15 Aug. 1975, pp. 224–226.
Takagi et al., "Crystal Growth", published in J. of Material Science, 12(3), Mar. 1977, pp. 517–521.

*Primary Examiner*—Gregory N. Clements
*Attorney, Agent, or Firm*—Serge Abend

[57] ABSTRACT

A method for laser induced conversion of large predefined areas of amorphous or polycrystalline semiconductor material, disposed nonepitaxially upon a substrate, into large single crystal areas, by controlling the lateral heat flow out of the melted regions of the areas for causing their recrystallization from a single nucleation site and for suppressing the formation of competitive nucleation sites at their edges.

22 Claims, 15 Drawing Figures

THERMAL GRADIENT CONTROL FOR ENHANCED LASER INDUCED CRYSTALLIZATION OF PREDEFINED SEMICONDUCTOR AREAS

This invention relates to a method for laser induced conversion of large predefined areas of amorphous or polycrystalline semiconductor material, disposed non-epitaxially upon a substrate, into large single crystal areas, by controlling the lateral heat flow out of melted regions of the areas for causing their recrystallization from a single nucleation site and for suppressing the formation of competitive nucleation sites at their edges.

Semiconductor devices are conventionally fabricated upon wafers of monocrystalline semiconductor material. It is well known that formation of these wafers is severely size limited, as they comprise transverse slices of an elongated single crystal ingot (boule). Silicon boules of only three to four inches in diameter are presently commonly available. Elimination of the wafer as the starting material for subsequent device fabrication, in favor of a single crystal film, or single crystalline areas within a film of a size sufficiently larger to be useable, grown non-epitaxially upon a suitable substrate, such as glass, could revolutionize semiconductor technology. A reliably low cost method for formation of large area arrays of active electronic elements with switching and addressing capabilities on a page-size monolithic substrate has long been sought. Such a non-epitaxial method could provide the medium for fabrication of large area displays and contribute to a three-dimensional integrated circuit technology.

An alternative to growing and processing the single crystal silicon boules is the conversion of polycrystalline silicon to single crystalline form by annealing and regrowth upon an insulating substrate. At present silicon-on-sapphire (SOS) technology is essentially the only commercial technique for producing crystalline semiconducting films on insulating substrates. This is an epitaxial growth process which requires a single crystalline substrate whose crystal lattice surface pattern acts as a kind of atomic template for the crystal growth of the overlayer film. However, this process would not be satisfactory for large area integration because the overall size of the SOS film is generally about three inches in diameter, as limited by the sapphire boule. Furthermore, the single crystal semiconductor material has not been of sufficiently high electronic grade. Secondly, the experimental process termed graphoepitaxy (see C & EN July 16, 1979) was developed as an alternative to SOS for converting large areas of amorphous silicon into a single crystalline film on readily available amorphous substrates. Since no regular atomic "template" is present in the amorphous substrate, it has been mimicked by a lithographically etched artificial grating or "template", having the right periodicity and profile. Repeated laser scanning anneals the film and converts it to crystalline material whose orientation is controlled by the grating direction.

A simple method for directly converting amorphous or polycrystalline material, disposed upon a suitable substrate, into usable monocrystals has been reported as far back as 1971. In U.S. Pat. No. 3,585,088 to Schwuttke et al a method is taught wherein such a film is deposited upon an amorphous substrate and is then selectively bombarded with a pulsed laser beam. By properly adjusting the beam, crystallization of the irradiated area takes place without vaporization of the film. As shown in FIG. 3 of that patent, the irradiated region may yield a series of monocrystals within the film. Also in 1971, U.S. Pat. No. 3,600,237 to Davis et al shows an attempt to increase the usable area of a recrystallized semiconductor film (InSb) disposed upon a suitable amorphous substrate, such as glass. Davis et al teach electron beam zone melting of the InSb film and the elimination of spurious nucleation at the edges of the parallel crystal zone by means of scribe lines passing through the film for confining nucleation to a crystal front emanating from a single seed. Electron bombardment heats all irradiated portions of the sample (film and substrate) indiscriminately, and Davis et al do not teach selectively heating certain regions by controlling the thermal input to the sample. More recently, investigations have lead to annealing predefined islands of polycrystalline silicon on suitable substrates, such as glass, for converting them to single crystal islands. Since islands may be created at known locations, it will be easy to perform subsequent repeated process functions necessary to fabricate usable active devices thereon. Single crystals with a minimum dimension of about 20 $\mu m \times 20$ $\mu m$ are sought. An island array is significantly more desirable than randomly located large area single crystals which may be produced by the method suggested by Schwuttke et al wherein there is a high probability that semiconductor active devices will bridge grain boundaries rather than being confined to the crystalline area. Gibbons et al teach in Applied Physics Letters 34(12) June 15, 1979 (pp. 831–833), depositing island arrays of polycrystalline silicon material supported upon a silicon nitride layer disposed upon a crystalline silicon substrate investigating the convertibility of these islands into single crystalline form by laser annealing. Of the photolithographically defined islands ranging in size from 2 $\mu m \times 20$ $\mu m$ to 20 $\mu m \times 160$ $\mu m$, only the small 2 $\mu m \times 20$ $\mu m$ islands were completely recrystallized and showed an absence of fine grain or amorphous structure after laser annealing. The larger islands included large polycrystalline grains arranged in a chevron pattern pointing in the direction of the laser scan. This evidences competing nucleation points. It should be further noted, however, that the 2 $\mu m \times 20$ $\mu m$ islands thus achieved, were no larger than randomly located crystalline regions Gibbons et al were able to obtain in a continuous film. Thus, there is no teaching which suggests how useable large area single crystalline islands may be formed nor, more importantly, that delineation of islands is facilitative in producing crystalline regions which are larger than can be produced in continuous films.

It would be highly desirable to provide a reliable process for converting large usable islands of single crystalline silicon from a polycrystalline or an amorphous starting material. We have found that this may be accomplished by heating and cooling the deposited islands in a controlled manner so as to induce nucleation at a single point and to establish a moving crystallization front radiating therefrom, while simultaneously suppressing the formation of competing nucleation centers at the island perimeter. Our novel method includes the steps of depositing an array of islands, formed of an optical energy absorbing crystallizable semiconductor material upon an amorphous or non-epitaxial crystalline substrate; providing an optical energy absorbing material, capable of being heated by an optical energy heat source, on the substrate in the area surrounding the islands in the array; and providing a thermal control structure in the region surrounding the islands for affecting the amount of optical energy absorbed in the region immediately surrounding each island to compensate for preferential heat losses at the island edges during cooling to the substrate. Then projecting an optical energy source over each island and its surrounding area for melting regions of the island and heating the optical energy absorbing layer. When the optical energy source has passed, controlled cooling of the islands and the optical energy absorbing layer, by thermal drain into the substrate, takes place. Thus, under the influence of the thermal control structure, a differential thermal gradient is established between the central portion of each island and the edges of each island for slowing the rate of cooling at the edges such that as the islands cool each will be converted to a single crystal and the appearance of competing crystal nucleation sites at the edges will be suppressed.

Many of the attendant advantages and the mode of operation of this invention will become more readily appreciated as the same becomes better understood by reference to the following detailed description when considered in connection with the accompanying drawings wherein.

Figure 1:
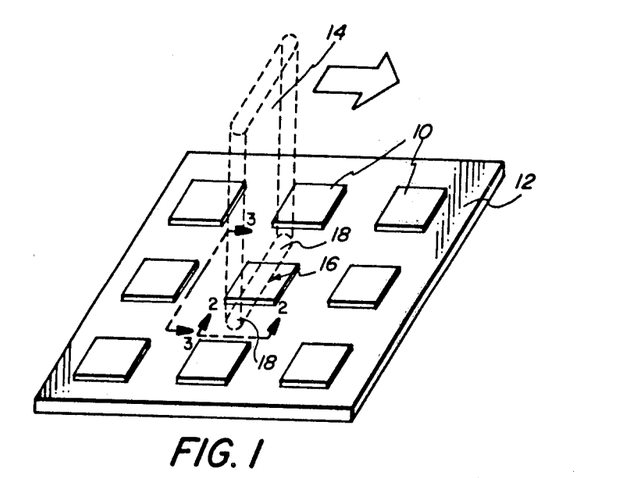
FIG. 1 shows in perspective view an array of crystallizable islands being scanned by an elongated laser spot in accordance with the instant invention.

Turning now to the drawings, in greater detail, there is shown in FIG. 1 an array of silicon islands 10 disposed upon a suitable substrate 12. As deposited, the islands are in the amorphous or fine grain polycrystalline form. By the term island we mean, of course, a prepositioned pattern of areas to be converted. For example, a stripe is to be considered an island whose length to width ratio is exceedingly large. After being irradiated by sweeping laser beam 14, moving in the direction of the arrow, each island is converted to a single crystal. An optical system (not shown) has been interposed between the laser source and the target to change the shape of the beam so that the laser "spot" 16 upon the target will be elongated, substantially as shown. A suitable scanning mechanism (also not shown) moves the "spot", relative to the island, in the direction of its short dimension, which is selected to be less than the island length in the direction of scan for incremental or zone heating of the island, while the long dimension is selected to exceed the island width for irradiating the immediately surrounding area 18 in order to accomplish the results of the instant invention. As it is desired to convert the islands into single crystalline material we have found that accurate heating and cooling of the islands 10 and its immediate surround 18 is important.

Figure 2:
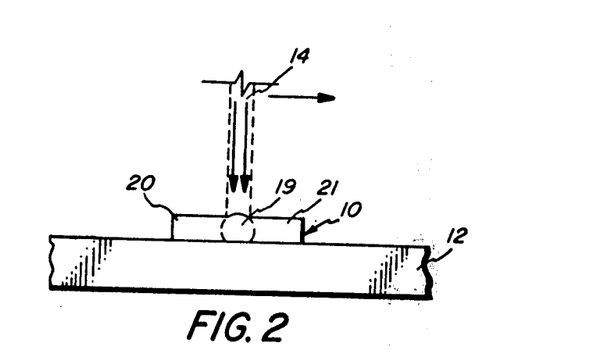
FIG. 2 is a front elevation view of the array of FIG. 1, taken substantially along line 2—2, showing the laser irradiating and melting a zone in a single island.
Figure 3:
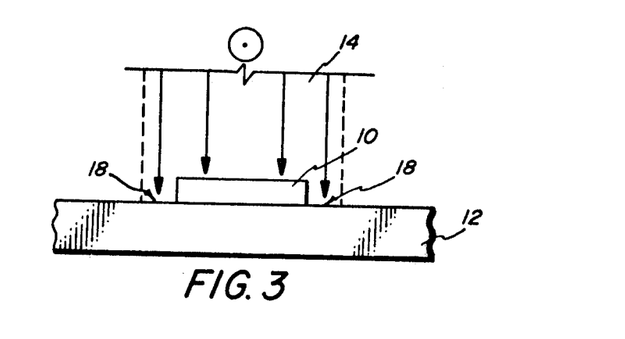
FIG. 3 is a left side elevation view of the array of FIG. 1, taken substantially along line 3—3, showing the laser irradiation zone extending laterally beyond a single island so as to act upon the surrounding material.

In FIG. 2, laser irradiation of the island is shown to be sufficiently intense to form a molten zone 19 within the island whose upper surface is seen to be convex. In the upstream area 20, the cooled crystallized portion of the island is slightly thinner than the downstream area 21 because of the mass transport of material in the molten zone. Upon passage of the laser spot and complete crystallization of the island, the surface will be slightly rippled and a small ridge of transported material will reside at its end.

Figure 4:
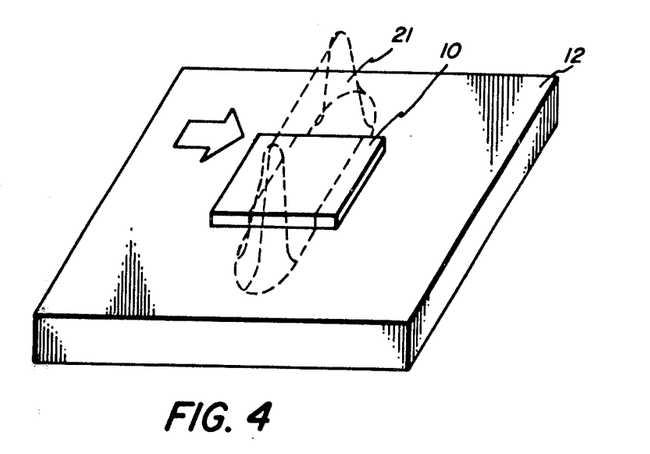
FIG. 4 shows in perspective view a single island on which is superimposed in phantom lines the spatial profile of the optical intensity of the laser spot.

An intensity profile of the laser spot, as shown in schematic perspective in FIG. 4, is seen to have a distribution 22 which falls off rapidly in the direction of laser travel and is effectively uniform normal to the direction of laser travel.

As the scanning laser spot moves, the mechanism of cooling occurs sequentially from the leading island edge onward. Thermal energy, accumulated in the island 10 is lost to the cooler substrate. Lateral heat flow, which is negligible in all the thin layers, occurs within the substrate which is sufficiently thick to allow this phenomenon. We have shown in FIGS. 5, 6 and 7 schematic representations of thermal energy loss to the substrate from the laser heated areas, under several conditions. These illustrations provide an explanation of the instant invention.

Figure 5:
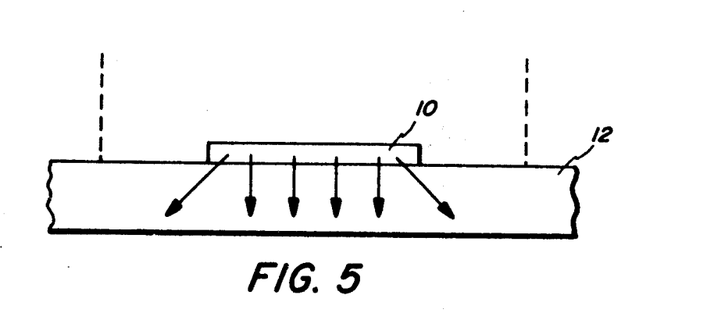
FIG. 5 is a side elevation view of an island upon a substrate, wherein the thermal control structure of this invention has not been incorporated, showing thermal losses to the substrate during cooling as represented by arrows whose length and direction generally indicate the velocity of heat loss.

In FIG. 5, an island of amorphous or polycrystalline semiconductor 10, such as silicon or germanium, which are known to absorb optical energy, is disposed upon a substrate, such as glass, which is not optical energy absorbing at the wavelength of the preferred optical energy sources. The island will be subject to optical energy irradiation from a scanning or pulsed laser, an infra-red source, a flash lamp or from any other suitable means with irradiation taking place in the zone between the dotted lines. Only the island will be heated, the exposed portions of the glass substrate surrounding the island will not absorb optical energy and will remain cool. Thus, when cooling of the island occurs, as shown by the arrows, the central portion of the island loses its heat directly into the glass substrate while the edge portions of the island lose heat more rapidly as thermal energy passes both downwardly and laterally outwardly into the cool substrate.

This heat flow pattern will result in cooler island edges at which plural nucleation locations will be established. As shown in FIG. 4, a sweeping laser spot will leave the leading edge of the island cooler than the lateral edges. Thus, desirably, nucleation will be initiated at the leading edge and crystal growth will extend therefrom. However, in the FIG. 5 situation nucleation can also be initiated at the lateral edges. Thus, competing crystallization fronts can radiate from several nucleation locations, resulting in a polycrystalline island.

In order to suppress competing nucleation between that desired at the lead edge and that undesired at the lateral edges, we have determined that by elevating the temperature of the surrounding area, heat flow from the island lateral edges into the substrate may be accurately controlled to the extent necessary to suppress edge nucleation. By providing an optical energy absorbing layer upon the glass substrate and irradiating this composite structure with a suitable optical energy source, the island surround also will be heated. If an optical energy absorbing substrate is used, the uppermost portion thereof functions as if it were a separate optical energy absorbing layer. Thermal losses to the substrate in the vicinity of the island edges will be additive, including heat from both the surround and the island edges.

Thus, the substrate will be hotter in the region of the lateral edges, resulting in a reduced rate of heat loss from the edges as compared to the central portion of the island. By controlling the amount of thermal input into the surrounding area, thermal loss to the substrate and the probability of edge nucleation can be controlled.

Figure 6:
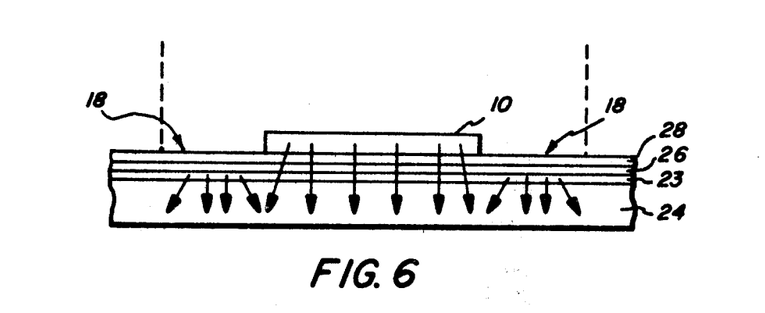
FIG. 6 is a side elevation view of a crystallizable island upon a substrate, showing tuning layers comprising one form of the thermal control structure of this invention and arrows indicating relative thermal losses to the substrate during cooling.

For example, in the thermal control embodiment of FIG. 6 an optical energy absorbing layer 23 has been deposited upon a nonabsorbing substrate 24. A pair of thin dielectric tuning layers 26 and 28 overlay absorbing layer 23 for controlling (tuning) the amount of thermal input into the absorbing layer. When the heat source has been removed and the system cools, heat will flow downwardly, as shown, to the cooler substrate directly below the central portion of the island. But, at the lateral island edges, where the surround 18 has also been heated, the optical absorbing layer 23 also seeks to lose heat to the cooler substrate below the island. Thus, there are additive contributions of heat flow to the substrate in this area. The shorter diagonal arrows represent a slower resultant rate of heat loss at island edges than at the island center. In other words, a controlled thermal gradient exists between the central portion of the island and the lateral edges thereof.

Figure 7:
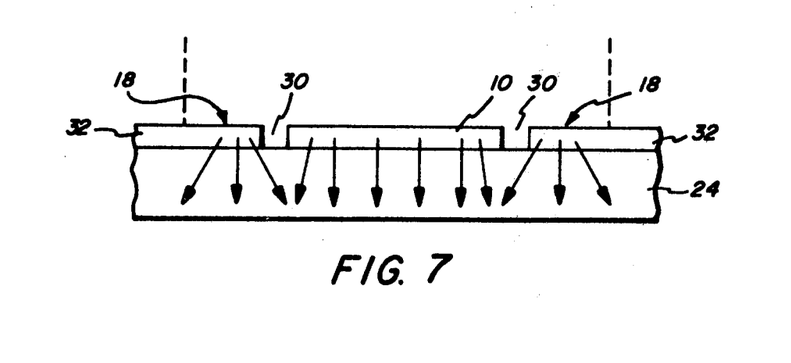
FIG. 7 is a side elevation view similar to FIG. 6 showing a moat and sea arrangement comprising another form of the thermal control structure of this invention.

Another thermal control embodiment is suggested in FIG. 7 wherein a moat 30 (absence of optical energy absorbing layer) and a sea 32 (existence of optical energy absorbing layer) surround each island. Only one island is shown, but it is to be understood that each island is so surrounded. As in FIGS. 5 and 6, a suitable optical energy source had been projected upon the island 10 and its immediate surrounding area 18 (as shown by the dotted lines) to heat the optical absorbing layers, namely, the island and the sea. The substrate is not optically absorbing and, therefore, in the area of the moat it will remain relatively cool. The heated sea and the heated island edge areas combine to lose their accumulated heat to the cooler substrate in the moat area. Thus, the island edges will be warmer and the thermal gradient between the island edges and their associated substrate will be smaller than the similar situation without a thermal control structure (as in FIG. 5). The resultant slower edge cooling (warmer edge area) suppresses the formation of nucleation locations at the edges.

The key to success in growing large area single crystal islands on a suitable substrate has been found to be a combination of suppression of competitive nucleation as described, and enhanced control of nucleation and growth from a single seed.

In FIGS. 8-11 single crystal growth is shown in several embodiments. Lateral thermal flow according to that described with regard to FIG. 6 takes place in the embodiments of FIGS. 8 and 9 while lateral thermal flow as shown in FIG. 7 takes place in the FIGS. 10 and 11 embodiments. In each, laser scanning takes place with a laser spot substantially as shown at 18 in FIG. 1, having an optical profile as shown at 21 in FIG. 4.

Figure 8:
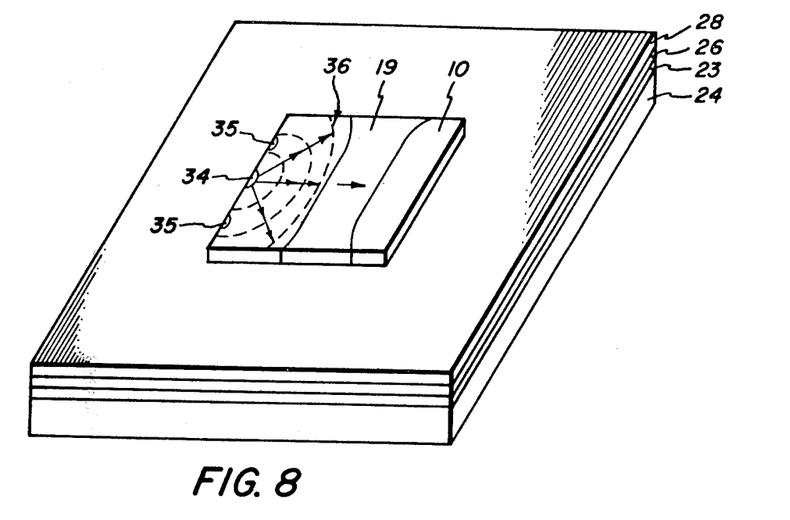
FIG. 8 shows in perspective view a single island with a sweeping molten zone and a single nucleation site at the center of its leading edge from which the crystallization front radiates.
Figure 9:
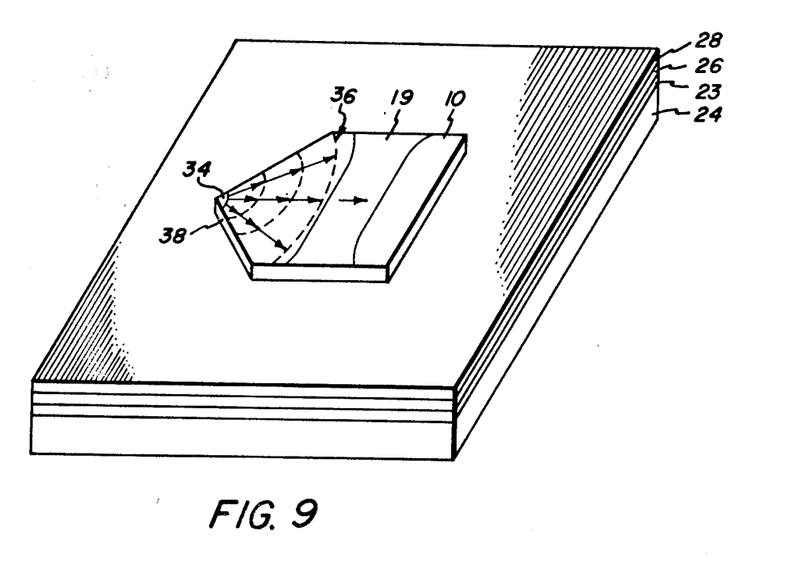
FIG. 9 shows in perspective view similar to FIG. 8 an alternative embodiment of island shape for enhanced control of nucleation.

In FIG. 8 the scanning laser spot moving over the island and its surrounding area, zone melts the island as shown at 19. It should be noted that the molten zone is seen to flare outwardly at the lateral edges due to the increased heat thereat. As the molten zone passes the island leading edge, its trailing edge will cool first and crystallization will begin. A nucleation site 34 will form, from which a crystallization front 36 radiates. We have found that although plural crystallization sites 35 are sometimes present on the leading edge one site generally establishes a dominant front. As fully explained above it is the intent of this invention to support a single crystallization front while suppressing competitive nucleation sites at the lateral island edges. This has been accomplished by reducing the rate of thermal flow from the edges, thereby maintaining the edges hot enough to prevent spontaneous nucleation. An improved island configuration 10' is shown in FIG. 9 wherein a tapered shape at the leading edge enhances self-seeding from a single point 38. This substantially eliminates the possibility of plural nucleation sites at the leading edge.

Figure 10:
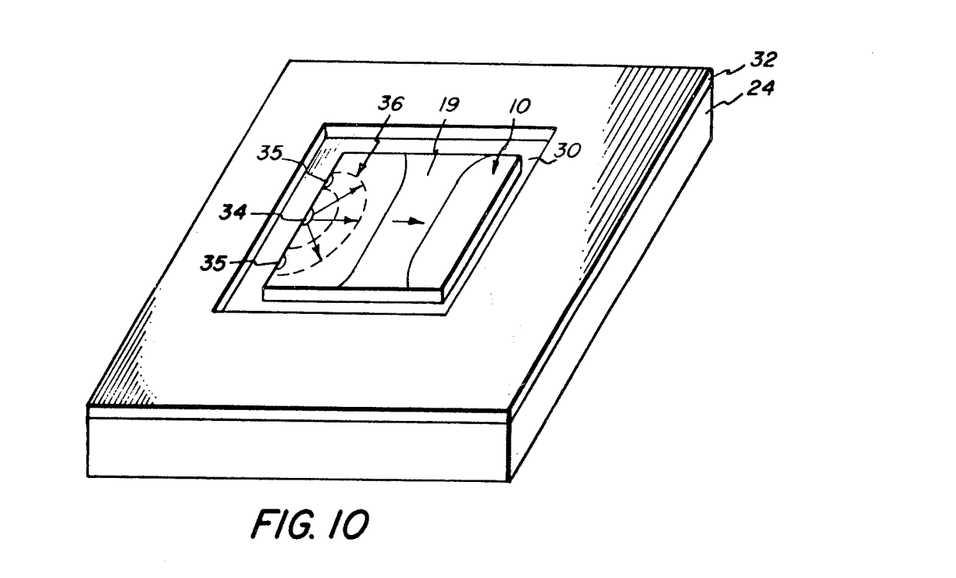
FIG. 10 shows in perspective view the embodiment of FIG. 7 including a moat and sea surrounding the single island, and also showing the single nucleation site, crystallization front and sweeping molten zone.
Figure 11:
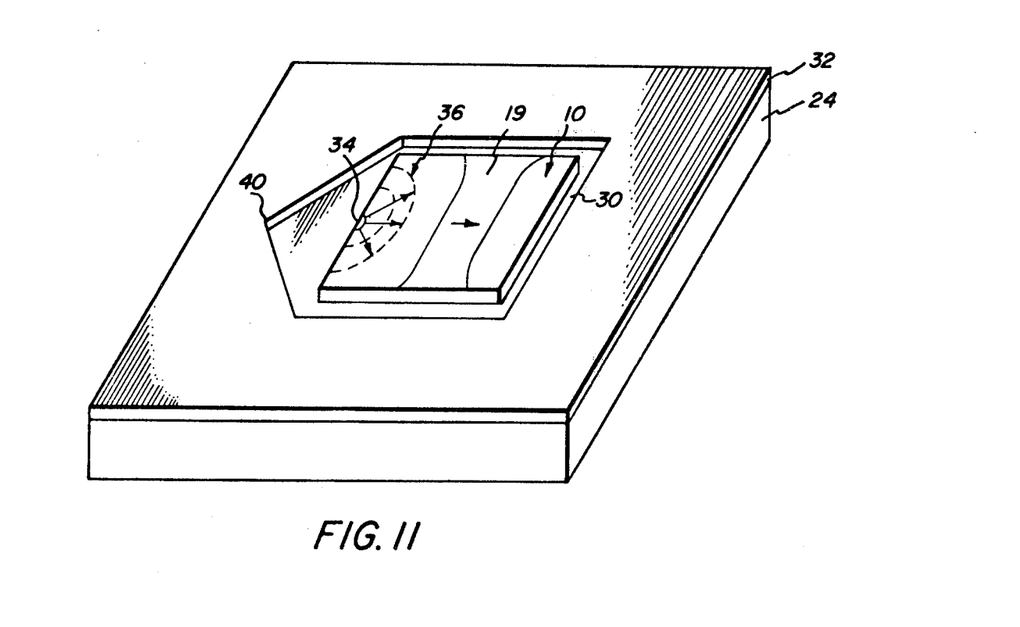
FIG. 11 shows in perspective view a modification of the FIG. 10 embodiment showing a variation of the moat configuration for enhanced control of nucleation.

In FIGS. 10 and 11 the moat configuration is shown in perspective for a better visual understanding of the system. Both figures illustrate nucleation of a single crystal and the crystal front propagating therefrom. In FIG. 10 a rectangular moat encircles a rectangular island. Leading edge nucleation occurs in a manner similar to that described with reference to FIG. 8. In FIG. 11 the moat has been tapered at 40 in advance of the island leading edge to enhance cooling at the center of the island leading edge.

Figure 12:
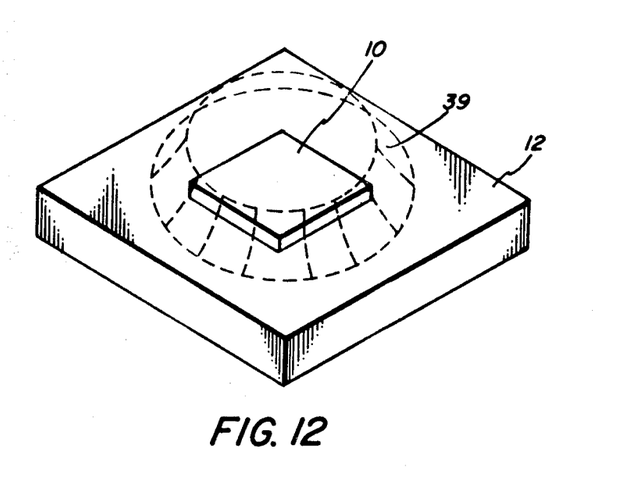
FIG. 12 is a perspective view of a single island on which is superimposed in phantom lines a profile of the optical intensity of a laser spot which heats the entire island and its immediate surround, simultaneously.
Figure 13:
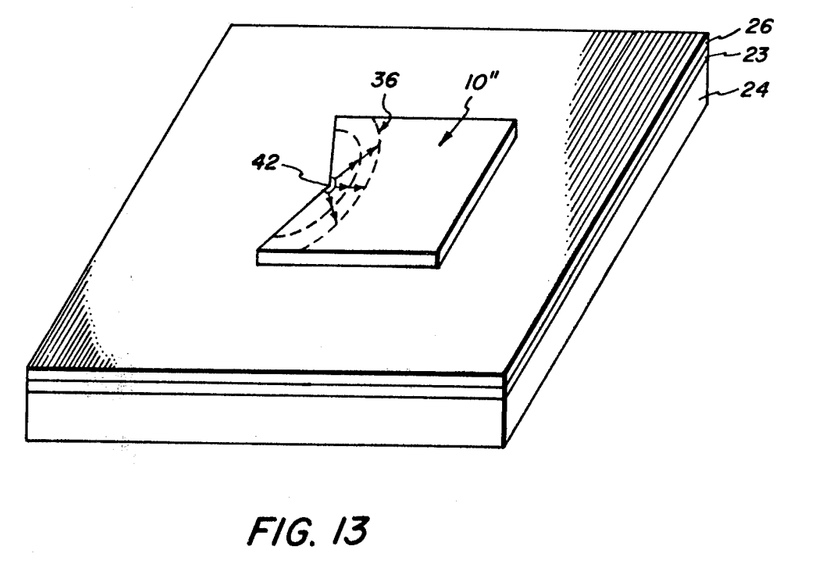
FIG. 13 shows in perspective view a single island shaped for enhanced control of nucleation when heating is accomplished in the manner of FIG. 12.

While describing the heating process of this invention as one of zone melting, it should be understood that our invention also comprehends heating the entire island and its immediate surrounding area, or plural islands and their surround, with a single, pulsed, large optical energy source. The mechanism of seeding and crystal growth described above also will be carried out in this form of the invention. FIGS. 12 and 13 are of note with respect to this means of heating. In FIG. 12, the optical intensity profile of a large area laser pulse is shown in phantom lines at 41 as being effectively uniform over the island 10 and falling off rapidly in the surround. FIG. 13 illustrates an example of another island configuration disposed upon a single dielectric thermal control layer, wherein the surround is hotter than the island under uniform illumination. In this mode, the interior point 42 will be heated less than the other exterior island points and will act as the nucleation center.

Now that the physical principles have been set forth, several examples of the parameters and materials utilized in our experiments shall be described. In the FIG. 8 configuration, the substrate 24 was made of silica ($SiO_2$) a non-optical energy absorbing material (for the particular laser utilized) upon which was disposed an optical absorbing layer 23 comprising a 1 $\mu$m CVD deposited polysilicon which in turn supported an 88 nm thermally grown dielectric oxide layer 26 over which was added a second thin dielectric layer comprising 64 nm of CVD deposited silicon nitride ($Si_3N_4$). Islands 10 of 0.5 $\mu$m thick CVD deposited polysilicon (also optical energy absorbing) over the nitride layer were photolithographically produced. A CW argon ion laser having a wavelength of 5145 A was formed into a collimated elliptical beam (with a ratio of diameters equal to three) and focused to a spot approximately 30 $\mu$m×90 $\mu$m. This spot was scanned in a direction normal to its wide dimension at 1 cm/sec over the central axes of the deposited islands so that the islands achieved a melting temperature of 1412° C. After laser scanning, the islands were studied in a TEM where it was observed that islands 20 $\mu$m wide by 20 $\mu$m long with no grain boundaries were present. We also observed the black body radiation from the laser heated area during annealing to confirm our analysis of the thermal control mechanism.

In order to optimally control the thermal input to the polysilicon optical absorbing layer and then to the island edges, as explained above, we have experimented with a dual dielectric ($SiO_2$ and $Si_3N_4$) overcoating of various thicknesses and therefore various reflectivities to obtain the optimal thermal tuning. Since the area surrounding the island is reflectively coated and the polysilicon island is uncoated, the surround will absorb less thermal energy than the island. We have also experimented with a single dielectric layer upon the optical absorbing layer, namely, the 88 nm oxide layer alone but as this configuration is maximally absorbing (nonreflecting) the surround absorbs more optical energy than the uncoated islands resulting in a net heat reflux to the islands. Edge heating in this instance appears to be undesirably strong. Although this single dielectric embodiment will yield the desired results it is not altogether satisfactory to maximize the lateral edge thermal profile because substrate damage due to extreme heating is possible. Since we seek to obtain the desired results with minimum heating of the substrate the dual dielectric tuning has been found to be preferable.

The configuration of FIGS. 10 and 11 is much simpler from a processing point of view. During fabrication of the fine grain polysilicon islands, instead of photolithographically stripping away the entire surrounding material between islands, only a moat 30 is removed. We have found that a moat of approximately 4 $\mu$m wide will be satisfactory. The thermal flow dynamics of this configuration have already been described. Suffice it to state that the moat is considered to be a control structure which provides an unheated zone in the nonabsorbing substrate which accepts heat from both the sea and from the island perimeter. This thermal addition moderates rapid heat loss from the island perimeter and slows formation of nucleation centers. After the laser annealing process has been completed, the surrounding sea material may be removed for device processing, or partially left as laser annealed coarse grained polysilicon connectors.

Figure 14:
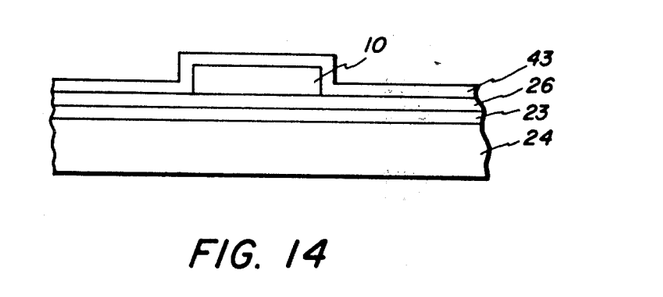
FIG. 14 is an elevation view of still another embodiment of this invention showing an encapsulating layer in conjunction with the tuning layer configuration.
Figure 15:
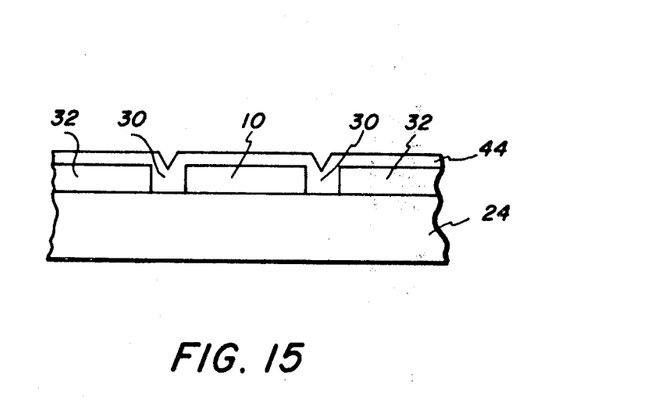
FIG. 15 is an elevation view of yet another embodiment of this invention showing an encapsulating layer in conjunction with the moat and sea configuration.

In FIGS. 14 and 15 we suggest the solution to a further problem, namely, that of retaining a smooth top surface on the islands after laser induced melting and recrystallization. The effects of surface tension and mass transport during melting have been observed to produce substantial thickness variations. For example, for the slow laser scan described (i.e. 1 cm/sec) the molten zone in a bare island is a convex, surface tension determined, ridge (see 19 in FIG. 2). Further, shock driven ripples quench into the solidifying topography and mass transport occurs to the trailing edge of the island. We have found that an encapsulating layer 43 retains the smooth upper surface of the island after laser annealing by preventing the surface deformation effects. In FIG. 14 a dielectric thin film such as $SiO_2$ or $Si_3N_4$, approximately 20 nm thick deposited over the amorphous or polycrystalline silicon islands and the area surrounding the islands will serve the dual function of encapsulation for topographic integrity and control of thermal energy acceptance by the optical absorbing material 22 in conjunction with a first dielectric layer 26 upon which it is deposited. Also, the single dielectric layer over the island will enhance the transmission of optical energy into the island (thus requiring less incident energy) and, because the dielectric melts at a higher temperature than silicon it will also suppress island ablation. Thus, the molten region can be forced to a higher temperature to improve crystal growth. In FIG. 15, the dielectric overlayer 44 is combined with the sea and moat embodiment to perform the same enhancing results described with reference to FIG. 14. It should be understood that the present disclosure has been made only by way of example, and that numerous changes in details of construction and the combination and arrangement of parts may be resorted to without departing from the true spirit and scope of the invention as hereinafter claimed.

What is claimed is:

1. A method of converting predefined areas of semiconductor material into single crystal areas comprising the steps of:

providing support means, providing an array of optical energy absorbing crystallizable semiconductor areas upon said support means, providing optical energy absorbing means upon said support means in the region adjacent to and around each of said areas, providing thermal control means, associated with said optical energy absorbing means, in the region adjacent to and around each of said areas, for effecting the amount of thermal energy absorbed in the region immediately adjacent to and around each area to compensate for perferential heat loss at the edges of each of said areas.

projecting an optical energy source wherein said source is a shaped laser spot upon and to expose a portion of each of said areas and that portion of said optical energy absorbing means and said thermal control means immediately adjacent and around each of said areas, and imparting relative motion between said spot and said substrate, said spot being of elongated shape such that its short dimension is less than the dimension of each of said areas in the direction of relative movement and its long dimension is greater than the dimension of each of said areas normal to the direction of relative movement, melting the exposed portion of each of said areas with said optical energy source, elevating the temperature of the exposed portion of said optical energy absorbing means with said optical energy source, removing said optical energy source, cooling said optical energy absorbing means by drawing heat stored therein into said support means, cooling said melted areas by drawing heat stored therein into said support means, and establishing a differential thermal gradient between the central portion of each of said areas and the edges of each of said areas for slowing the rate of cooling at said edges such that as said melted areas cool, each will crystallize from a single nucleation location and competitive nucleation locations at said edges will be suppressed, whereby each of said areas will be converted to a single crystal when cooled.

2. The method of claim 1 comprising providing said support means as an amorphous substrate which does not absorb said projected optical energy, providing said optical energy absorbing means by depositing an amorphous or polycrystalline silicon optical energy absorbing layer on said substrate, providing said thermal control means by depositing a first dielectric layer of silicon dioxide on said optical energy absorbing layer and depositing a second dielectric layer of silicon nitride on said silicon dioxide layer, and providing said array by depositing a pattern of amorphous or polycrystalline silicon islands on said silicon nitride layer.

3. The method of claim 1 wherein said step of providing thermal control means comprises forming a moat immediately adjacent to and around each of said areas.

4. The method of claim 1 comprising providing said support means as an amorphous substrate which does not absorb said projected optical energy, providing said optical energy absorbing means by depositing an amorphous or polycrystalline silicon optical energy absorbing layer on said substrate and providing said thermal control means by removing portions of said optical energy absorbing layer in a pattern so as to define moats adjacent each of said areas with a sea of optical energy absorbing material surrounding said moats, whereby said moats affect the amount of absorbed optical energy adjacent each of said areas by providing a zone of non-absorption immediately adjacent each of said areas.

5. The method of claim 4 comprising removing a tapering region of said optical energy layer in advance of that edge of each of said areas which is first crossed by said scanning elongated laser spot.

6. The method of claim 1 comprising further including the step of encapsulating each of said areas for maintaining the upper surface of each of said areas smooth after it has recrystallized from the melt.

7. The method of claim 6 wherein said step of encapsulating comprises depositing a dielectric layer over each of said areas.

8. The method of claim 1 comprising providing said support means as an amorphous substrate which does not absorb said projected optical energy, providing said optical energy absorbing means by depositing an amorphous or polycrystalline silicon optical energy absorbing layer on said substrate, providing said thermal control means by first depositing a first dielectric layer of silicon dioxide on said optical energy absorbing layer, providing said array of areas by depositing a pattern of amorphous or polycrystalline silicon islands on said first dielectric layer, and depositing a second dielectric layer of silicon nitride over said islands and over said first dielectric layer, the portion of said second dielectric layer overlying said first dielectric layer forming a portion of said thermal control means.

9. The method of claim 1 comprising providing said support means as an amorphous substrate which does not absorb said projected optical energy, providing said optical energy absorbing means by depositing an amorphous or polycrystalline silicon optical energy absorbing layer on said substrate, providing said thermal control means by first removing portions of said layer in a pattern so as to define islands with moats therearound in a sea of optical energy absorbing material, and then depositing a dielectric overlayer of silicon nitride on said sea, said moat and said islands.

10. A method of converting predefined areas of semiconductor material into single crystal areas comprising the steps of:

providing support means, providing an array of optical energy absorbing crystallizable semiconductor areas upon said support means, providing optical energy absorbing means upon said support means in the region adjacent to and around each of said areas, providing thermal control means, associated with said optical energy absorbing means, in the region adjacent to and around each of said areas, for affecting the amount of thermal energy absorbed in the region immediately adjacent to and around each of said areas to compensate for preferential heat loss at the edges of each of said areas, encapsulating each of said areas by providing a layer of material over each of said areas, projecting an optical energy source, upon and to expose a portion of each of said areas, and its encapsulating layer, and that portion of said optical energy absorbing means and said thermal control means immediately adjacent to and around each of said areas, melting the exposed portion of each of said areas with said optical energy source, elevating the temperature of the exposed portion of said optical energy absorbing means with said optical energy source, removing said optical energy source, cooling said optical energy absorbing means by drawing heat stored therein into said support means, cooling said melted areas by drawing heat stored therein into said support means, and establishing a differential thermal gradient between the central portion of each of said areas and the edges of each of said areas for slowing the rate of cooling at said edges such that as said melted areas cool, each will crystallize from a single nucleation location and competitive nucleation locations at said edges will be suppressed, whereby each of said areas will be converted to a single crystal when cooled.

11. The method of claim 10 wherein said step of projecting an optical energy source comprises projecting a laser spot and imparting relative motion between said spot and said array of areas.

12. The method of claim 11 comprising shaping said projected laser spot such that it is elongated, and imparting relative motion between said spot and said array of areas in the direction of the short dimension of said elongated spot.

13. The method of claim 12 comprising shaping said elongated laser spot such that its short dimension is less than the dimension of each of said areas in the direction of relative movement and its long dimension is greater than the dimension of each of said areas normal to the direction of relative movement.

14. The method of claim 1 or claim 13 wherein said step of providing thermal control means comprises depositing a pair of dielectric layers upon said optical energy absorbing means which layers affect the amount of optical energy absorbed by said optical energy absorbing means by reflecting a portion of said energy.

15. The method of claim 1 or claim 10 wherein said step of providing thermal control means comprises depositing a single dielectric layer upon said optical energy absorbing means which layer affects the amount of optical energy absorbed by said optical energy absorbing means by transmitting substantially all of said optical energy through said dielectric layer.

16. The method of claim 1 or claim 13, or claim 10 wherein said steps of providing support means and providing optical energy absorbing means are accomplished simultaneously by providing an optical energy absorbing substrate.

17. The method of claim 1, claim 13 or claim 10 comprising patterning said areas as an array of islands.

18. The method of claim 17 wherein said step of patterning comprises providing an array of chevron shaped islands having tapered leading edges whose apexes are first crossed by said scanning elongated laser spot.

19. The method of claim 10 comprising patterning said areas as islands and projecting an optical energy source completely over a single island and the region immediately surrounding said island.

20. The method of claim 19 comprising projecting an optical energy source over a region encompassing more than one island in said array.

21. The method of claim 10 comprising providing said support means as an amorphous substrate which does not absorb said projected optical energy, providing said optical energy absorbing means by depositing an amorphous or polycrystalline silicon optical energy absorbing layer on said substrate, providing said thermal control means by first depositing a first dielectric layer of silicon dioxide on said optical energy absorbing layer, providing said array of areas by depositing a pattern of amorphous or polycrystalline silicon islands on said first dielectric layer, and said step of encapsulating each of said areas comprises depositing a second dielectric layer of silicon nitride over said islands and over said first dielectric layer, the portion of said second dielectric layer overlying said first dielectric layer forming a portion of said thermal control means.

22. The method of claim 10 comprising providing said support means as an amorphous substrate which does not absorb said projected optical energy, providing said optical energy absorbing means by depositing an amorphous or polycrystalline silicon optical energy absorbing layer on said substrate, providing said thermal control means by first removing portions of said layer in a pattern so as to define islands with moats therearound in a sea of optical energy absorbing material, and said step of encapsulating said areas comprises depositing a dielectric overlayer of silicon nitride on said sea, said moat and said islands.

* * * * *

UNITED STATES PATENT AND TRADEMARK OFFICE
CERTIFICATE OF CORRECTION

PATENT NO. : 4,330,363
DATED : May 18, 1982
INVENTOR(S) : DAVID K. BIEGELSEN ET AL

It is certified that error appears in the above-identified patent and that said Letters Patent are hereby corrected as shown below:

In the title page of the patent, the following errors should be corrected as to the spelling of the inventors' names:

Patentee Name [19]    "Biegesen" should be "Biegelsen"

Inventors: [75]    "Biegesen" should be "Biegelsen"
"Bartlelink" should be "Bartelink"

Signed and Sealed this

Twenty-sixth Day of February 1985

[SEAL]

*Attest:*

DONALD J. QUIGG

*Attesting Officer*    *Acting Commissioner of Patents and Trademarks*